(12) United States Patent
Wang et al.

(10) Patent No.: US 10,923,865 B2
(45) Date of Patent: Feb. 16, 2021

(54) ELECTRONIC APPARATUS CONNECTION CABLE WITH IDENTIFICATION INFORMATION PROVIDING FUNCTION

(71) Applicant: ATEN INTERNATIONAL CO., LTD., New Taipei (TW)

(72) Inventors: Hsi-Pang Wang, New Taipei (TW); Manu Chen, New Taipei (TW)

(73) Assignee: ATEN INTERNATIONAL CO., LTD., New Taipei (TW)

( * ) Notice: Subject to any disclaimer, the term of this patent is extended or adjusted under 35 U.S.C. 154(b) by 0 days.

(21) Appl. No.: 16/799,872

(22) Filed: Feb. 25, 2020

(65) Prior Publication Data

US 2020/0343676 A1    Oct. 29, 2020

(30) Foreign Application Priority Data

Apr. 23, 2019    (TW) .............................. 108114116 A (51) Int. Cl.
| | |
|---|---|
| *H01R 13/717* | (2006.01) |
| *H01R 13/66* | (2006.01) |
| *G08B 5/36* | (2006.01) |
| *H01R 13/641* | (2006.01) |
| *H01R 13/70* | (2006.01) |

(52) U.S. Cl.
CPC .............. *H01R 13/717* (2013.01); *G08B 5/36* (2013.01); *H01R 13/641* (2013.01); *H01R 13/6675* (2013.01); *H01R 13/701* (2013.01)

(58) Field of Classification Search
CPC  H01R 13/717; H01R 13/641; H01R 13/6675; H01R 13/701; G08B 5/36

USPC ......................................................... 340/654
See application file for complete search history.

(56) References Cited

U.S. PATENT DOCUMENTS

| | | | | |
|---|---|---|---|---|
| 7,049,937 | B1* | 5/2006 | Zweig | H01R 13/641 |
| | | | | 324/66 |
| 9,619,979 | B1* | 4/2017 | Montero | H01R 13/641 |
| 9,991,649 | B1* | 6/2018 | Nguyen | H01R 13/465 |
| 2003/0158977 | A1* | 8/2003 | Barrenscheen | G06F 13/4068 |
| | | | | 710/8 |
| 2007/0205667 | A1* | 9/2007 | Lin | G06F 13/409 |
| | | | | 307/42 |
| 2008/0215765 | A1* | 9/2008 | Butler | G06F 13/4081 |
| | | | | 710/15 |
| 2009/0109050 | A1* | 4/2009 | Sullivan | H04L 43/00 |
| | | | | 340/691.1 |
| 2012/0212349 | A1* | 8/2012 | Chang | H01R 13/6691 |
| | | | | 340/654 |

(Continued)

FOREIGN PATENT DOCUMENTS

TW    M335850    7/2008

*Primary Examiner* — Kerri L McNally
(74) *Attorney, Agent, or Firm* — Winston Hsu (57) ABSTRACT

An electronic apparatus connection cable includes: a first plug including a first power reception terminal; a first switch coupled to the first power reception terminal; a power transmission line coupled to the first switch; a second plug coupled to the power transmission line; and a first light emitting element coupled to the power transmission line. The distance between the first light emitting element and the second plug is smaller than a distance between the first emitting device and the first plug. When the first power reception terminal receives a first input voltage and the first switch is conducted, the first light emitting element emits light.

16 Claims, 5 Drawing Sheets

(56) References Cited

U.S. PATENT DOCUMENTS

| 2014/0210631 A1* | 7/2014 | Zavis ........................ G01L 1/16 |
| --- | --- | --- |
| | | 340/815.45 |
| 2015/0004832 A1* | 1/2015 | Homan ................ H01R 13/717 |
| | | 439/490 |
| 2018/0131142 A1* | 5/2018 | Satheesh ............ H01R 13/7175 |

* cited by examiner

ELECTRONIC APPARATUS CONNECTION CABLE WITH IDENTIFICATION INFORMATION PROVIDING FUNCTION

BACKGROUND OF THE INVENTION

1. Field of the Invention

The present invention relates to an electronic apparatus connection cable, and more particularly, to an electronic apparatus connection cable capable of providing indication messages.

2. Description of the Prior Art

Electronic apparatus connection cables are arranged to connect to multiple electronic apparatuses for providing communications paths, and the architectures thereof might be based on the corresponding electronic apparatuses. Commonly-seen electronic apparatus connection cables include HDMI cables, USB cables, network cables, etc. However, some systems might use a plenty of electronic apparatus connection cables. For example, some residences may have collector boxes which contain many electronic apparatus connection cables for connecting to electronic apparatuses that distribute everywhere in the house. Further, electronic apparatus connection cables are also widely seen in the server room of telecomm companies, and in-between telecommunication equipment.

However, conventional electronic apparatus connection cables so far still cannot provide indication messages. Hence, if a large amount of electronic apparatus connection cables are applied simultaneously, it raises the difficulty for the user to identify which plugs belong to a particular electronic apparatus connection cable, and to identify whether a particular electronic apparatus connection cable is connected to a source terminal or a reception terminal.

SUMMARY OF THE INVENTION

Therefore, an objective of the present invention is to provide an electronic apparatus connection cable, which can provide identification data for users to determine the plugs that belong to a same electronic apparatus connection cable Another objective of the present invention is to provide an electronic apparatus connection cable, which is capable of providing identification data for the user to determine whether a plug of a particular electronic apparatus connection cable is connected to a source terminal or a reception terminal.

An embodiment of the present invention discloses an electronic apparatus connection cable, comprising: a first plug comprising a first power reception terminal; a first switch coupled to the first power reception terminal; a power transmission line coupled to the first switch; a second plug coupled to the power transmission line; and a first light emitting element coupled to the power transmission line. The distance between the first light emitting element and the second plug is smaller than a distance between the first emitting device and the first plug. When the first power reception terminal receives a first input voltage and the first switch is conducted, the first light emitting element emits light.

An embodiment of the present invention discloses an electronic apparatus connection cable comprising a first plug. The first plug comprises a first power reception terminal, a connection-status determining circuit and a state-indication device. The connection-status determining circuit is coupled to the first power reception terminal, and is arranged to generate an inform signal according to whether the first plug is connected to a source terminal or a reception terminal. The state-indication device is coupled to the connection-status determining circuit, and generates at least one state indication message according to the inform signal.

According to the embodiment of the present invention, the proposed electronic apparatus connection cable may provide identification data for the user to determine which plugs belong to a same electronic apparatus connection cable, and to determine whether a particular plug is connected to a source terminal or a reception terminal. In this way, it is easy for the user to correctly connect an electronic apparatus even when there are a plenty of electronic apparatus connection cables.

These and other objectives of the present invention will no doubt become obvious to those of ordinary skill in the art after reading the following detailed description of the preferred embodiment that is illustrated in the various figures and drawings.

DETAILED DESCRIPTION

The following embodiments are used to illustrate the concepts of the present invention. Please note that these embodiments are merely for illustrative purposes, and are not used to limit the scope of the present invention. In addition, the terms "first," "second" in the embodiments are merely for distinguishing different elements, rather than limiting the order of these elements.

Figure 1:
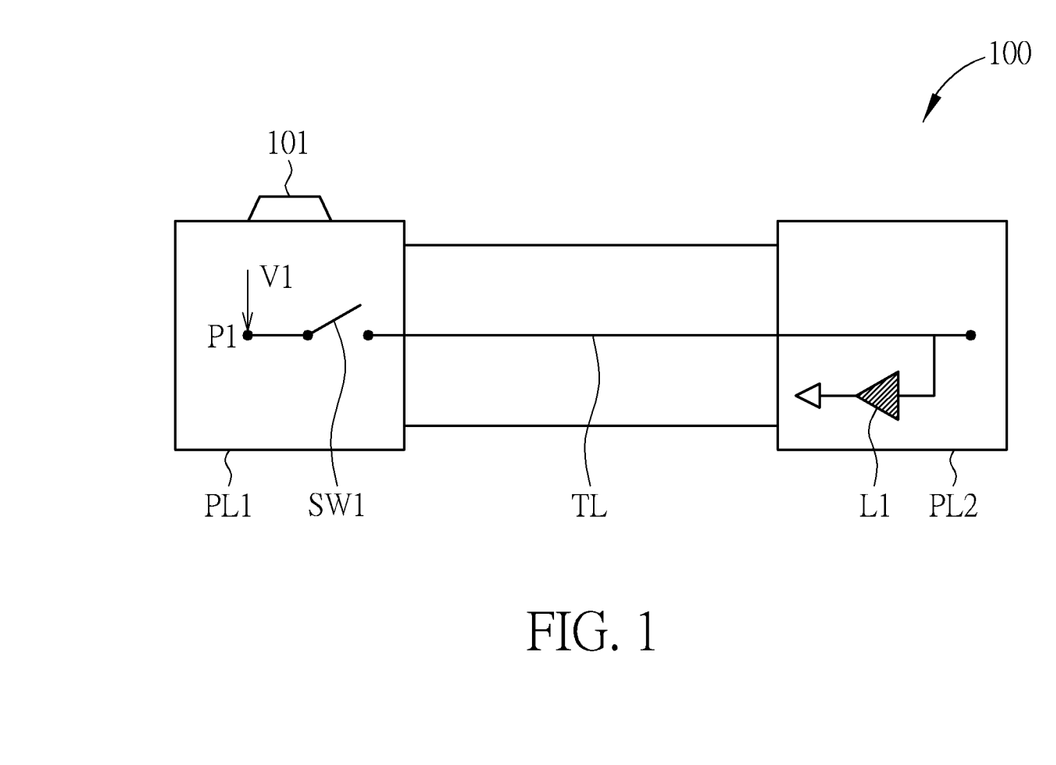
FIG. 1 is a diagram illustrating an electronic apparatus connection cable according to an embodiment of the present invention.

FIG. 1 is a diagram illustrating an electronic apparatus connection cable according to an embodiment of the present invention. As shown in FIG. 1, the electronic apparatus connection cable 100 comprises a first plug PL1, a first switch SW1, a power transmission line TL, a second plug PL2 and a first light emitting element L1. The first plug PL1 comprises a first power reception terminal P1 which may be arranged to receive a first input voltage V1. In one embodiment, the first input voltage V1 comes from the electronic apparatus coupled to the electronic apparatus connection cable 100, and the first power reception terminal P1 may be a pin. In another embodiment, the electronic apparatus connection cable 100 further comprises a battery configured therein (not shown) that provides the first input voltage V1.

The first switch SW1 is coupled to the first power reception terminal P1, and the power transmission line TL is coupled to the first switch SW1. The second plug PL2 and the first light emitting element L1 are also coupled to the power transmission line TL. The power transmission line TL may be an independent transmission line, and may also be a transmission line integrated in the electronic apparatus connection cable 100 coupled to the first plug PL1 and the second plug PL2, for transmitting other signals. When the first power reception terminal P1 receives the first input voltage V1 and the first switch SW1 is conducted, the first light emitting element L1 emits light. The conduction of the first switch SW1 may be triggered with different approaches. In one embodiment, the first plug PL1 has a trigger switch 101 (e.g. a button) on the top. When the trigger switch 101 is triggered, the first switch SW1 will be conducted and make the first light emitting element L1 emit light. The trigger switch 101 may be located at any location of the electronic apparatus connection cable 100, and may be any type of switch.

According to the embodiment in FIG. 1, by using the trigger switch 101 to make the first light emitting element L1 emit light, the user may easily determine which plug among multiple plugs belongs to the same electronic apparatus connection cable to which the first plug PL1 belongs to. Please note that in the embodiment of FIG. 1, although the first light emitting element L1 is located in the second plug PL2, the first light emitting element L1 may also be modified to be outside the second plug PL2, or at any location of the electronic apparatus connection cable 100 as long as the emitted light facilitates identifying the second plug PL2 for the user. In one embodiment, the distance between the first light emitting element L1 and the second plug PL2 is smaller than the distance between the first light emitting element L1 and the first plug PL1. This design allows the user to identify the second plug PL2 more easily. The electronic apparatus connection cable 100 may be any type of connection cable, and is applicable to the present invention as long as it is capable of receiving power to make first light emitting element L1 emit light. In one embodiment, the electronic apparatus connection cable 100 may be an HDMI cable, and the first power reception terminal P1 may be the 5V pin thereof.

The embodiment of FIG. 1 discloses a single-directional identification architecture, which can only refer to the first light emitting element L1 corresponding to the first plug PL1 trigger to determine which plug belong to the same electronic apparatus connection cable to which the first plug PL1 belongs. The embodiment of FIG. 2 discloses a two-directional identification architecture. That is, any of the first plug PL1 and the second plug PL2 may be used to determine which plug belong the same electronic apparatus connection cable to which the current plug belongs. Please refer to FIG. 2, other than the elements already comprised in the electronic apparatus connection cable 100, the electronic apparatus connection cable 200 further comprises the second power reception terminal P2, the second switch SW2 and the second light emitting element L2. The second light emitting element L2 emits light when second power reception terminal P2 receives the second input voltage V2 and the second switch SW2 is conducted. Hence, the user can refer to the second light emitting element L2 corresponding to the second plug PL2 to determine which plug belong to the same electronic apparatus connection cable to which the second plug PL2 belongs. The operations of the second power reception terminal P2, the second switch SW2 and the second light emitting element L2 are identical to those of the first power reception terminal P1, the first switch SW1 and the first light emitting element L1 shown in FIG. 1, and thus are omitted here for brevity.

Figure 2:
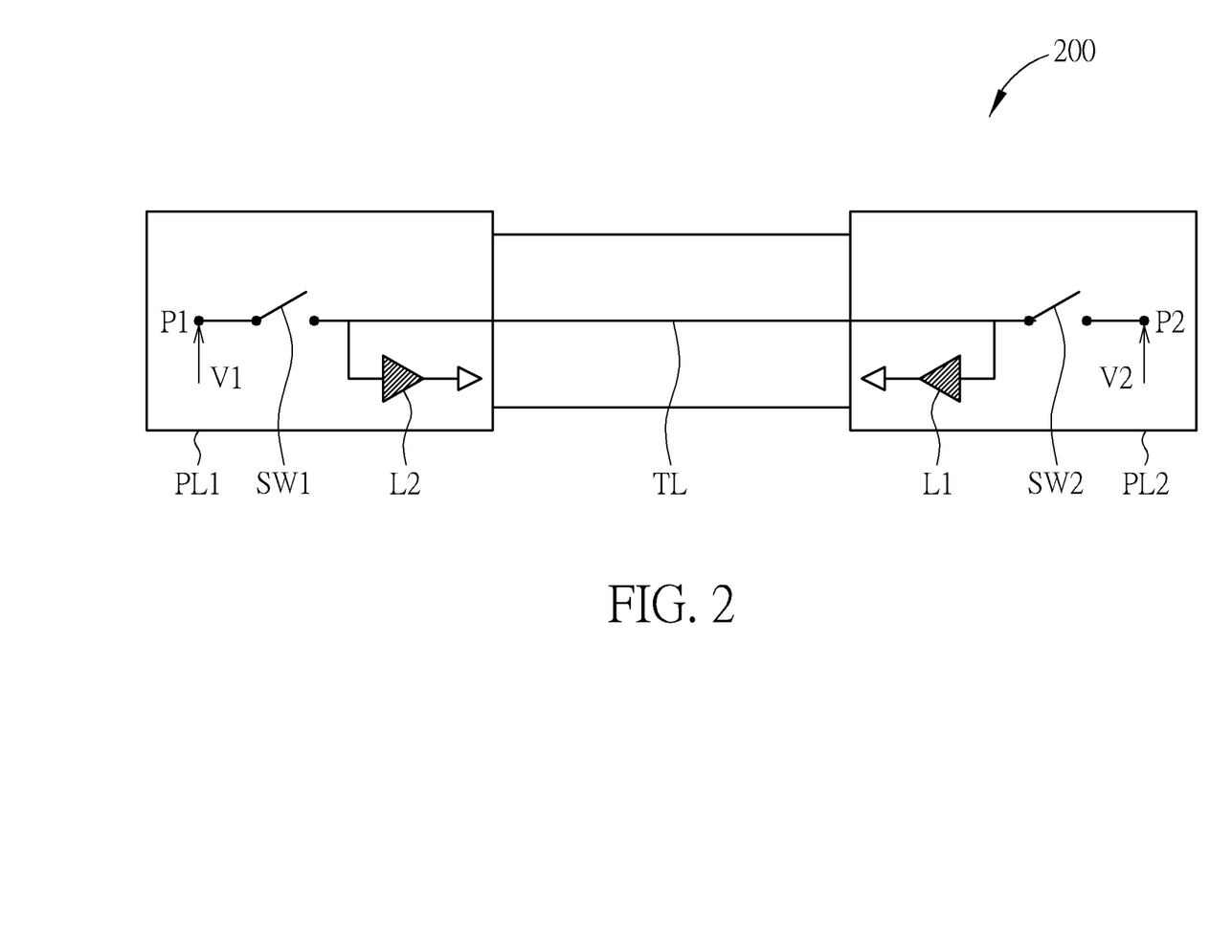
FIG. 2 is a diagram illustrating another electronic apparatus connection cable according to an embodiment of the present invention.

However, in the embodiment of FIG. 2, when the first switch SW1 is conducted, both the first light emitting element L1 and the second light emitting element L2 emit light; and when the second switch SW2 is conducted, both the first light emitting element L1 and the second light emitting element L2 emit light. However, the way of the connection may be modified so that when first switch SW1 is conducted, only the first light emitting element L1 emits light; and when second switch SW2 is conducted, only the second light emitting element L2 emits light. This kind of modification also falls with the scope of the present invention.

The electronic apparatus connection cable provided by the present invention may also comprise other identification mechanisms. When the electronic apparatus connection cable is connected to two electronic apparatuses, in general, one of the electronic apparatuses is the source terminal and the other is the reception terminal, wherein the source terminal provides power to the electronic apparatus connection cable while the reception terminal does not provide power to the electronic apparatus connection cable. For example, when the computer host is connected to the monitor, the computer host is the source terminal and the monitor is the reception terminal. In another example, when an electronic apparatus provides signals to another electronic apparatus, the electronic apparatus that provides the signals is the source terminal and the electronic apparatus that receives signals is the reception terminal.

Figure 3:
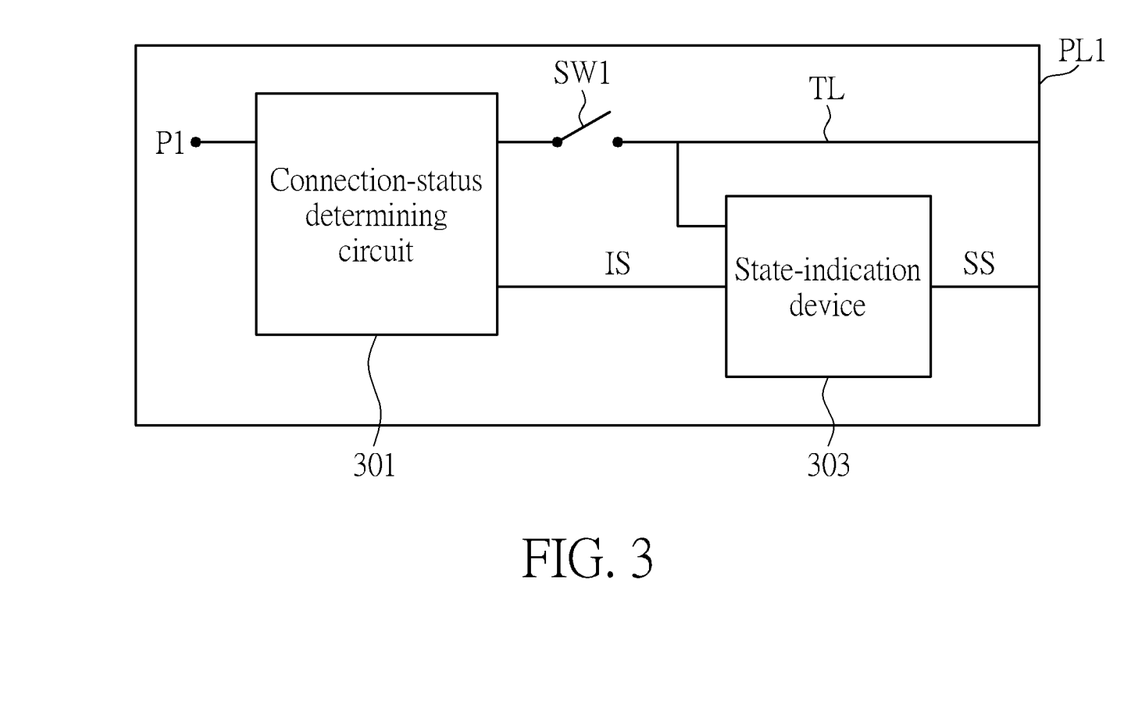
FIG. 3 is a diagram illustrating another electronic apparatus connection cable according to an embodiment of the present invention.

FIG. 3 is a diagram illustrating another electronic apparatus connection cable according to an embodiment of the present invention. Please note that, although FIG. 3 merely depicts the architecture of the first plug PL1, the second plug PL2 may comprise an architecture identical to that of the first plug PL1. As shown in FIG. 3, in addition to the first switch SW1 shown in FIG. 1, the plug PL1 further comprises a connection-status determining circuit 301 and a state-indication device 303. The connection-status determining circuit 301 is coupled to the first power reception terminal P1 and the first switch SW1, and is arranged to generate an inform signal IS according to whether the first plug P1 is connected to a source terminal or a reception terminal. The state-indication device 203 is coupled to the connection-status determining circuit 301 and the first switch SW1, and generates at least one state indication message SS according to the inform signal IS. The state indication message SS may be light, sound or the combination of the two, but the present invention is not limited thereto.

Figure 4:
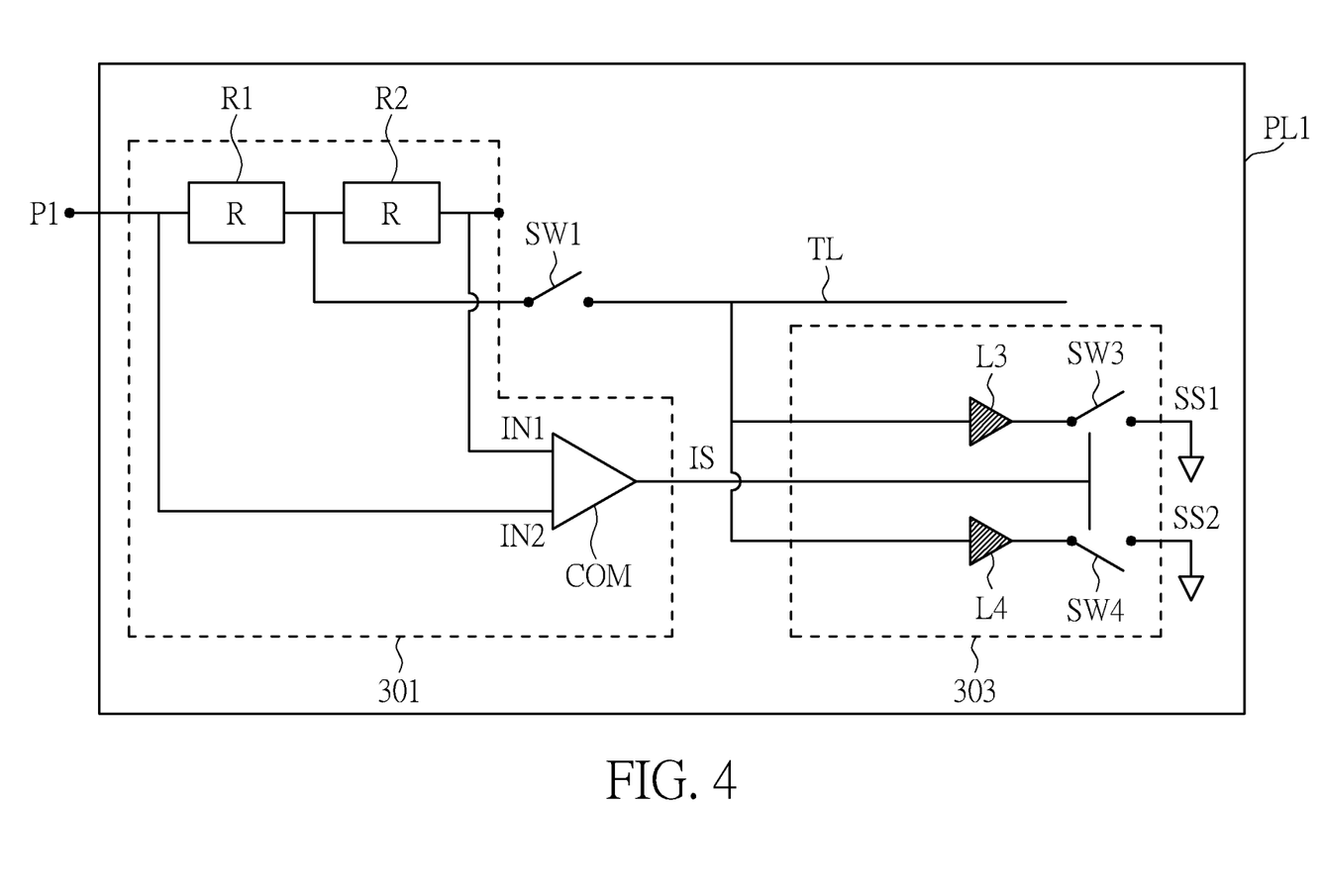
FIG. 4 is a circuit diagram according to the embodiment shown in FIG. 3.

FIG. 4 is a circuit diagram according to the embodiment shown in FIG. 3. As shown in FIG. 4, the connection-status determining circuit 301 comprises a resistor series that comprises at least two resistors (such as the resistors R1 and R2 in this embodiment). The comparator COM comprises a first input terminal IN1 and a second input terminal IN2, respectively coupled to the resistors R1 and R2 (as shown in FIG. 4). When the voltage at the first input terminal IN1 is lower than the voltage at the second input terminal IN2 (this happens when the first plug L1 is connected to the source terminal and the second plug L2 is connected to the reception terminal), the comparator COM generates the inform signal IS that has a first logic level ("1" in this example). When the voltage at the first input terminal IN1 is higher than the voltage at the second input terminal IN2 (this happens when the first plug L1 is connected to the reception terminal and the second plug L2 is connected to the source terminal), the comparator COM generates the inform signal IS with a second logic level ("0" in the example). The state-indication device 303 generates a first state indication message SS1 when the inform signal IS has the first logic level, and generates a second state indication message SS2 when the inform signal IS has the second logic level. The first state indication message SS1 and the second state indication message SS2 may be light, sound or the combination of the two, but the present invention is not limited thereto.

In one embodiment, as shown in FIG. 4, the state-indication device 303 comprises a third light emitting element L3, a third switch SW3, a fourth light emitting element L4 and a fourth switch SW4. The third light emitting element L3 is coupled to the first switch SW1. The third switch SW3 is coupled to the third light emitting element L3, and becomes conducted when the inform signal IS has the first logic level. In addition, when both the first switch SW1 and the third switch SW3 are conducted, the third light emitting element L3 emits light to generate the first state indication message SS1. The fourth light emitting element L4 is coupled to the first switch SW1. The fourth switch SW4 is coupled to the fourth light emitting element L4, and becomes conducted when the inform signal IS has the second logic level. When both the first switch SW1 and the fourth switch SW4 are conducted, the fourth light emitting element SW4 emits light to generate the second state indication message SS2.

In one embodiment, the third switch SW3 is an NPN BJT and the fourth switch SW4 is a PNP BJT, but the present invention is not limited thereto. Those elements can be replaced with other transistors, such as MOS elements. Further, by using current technologies, one skilled in the art is readily to add resistors or capacitors in the architecture shown in FIG. 4, to endue each element with proper current characteristics or resistive characteristics.

Figure 5:
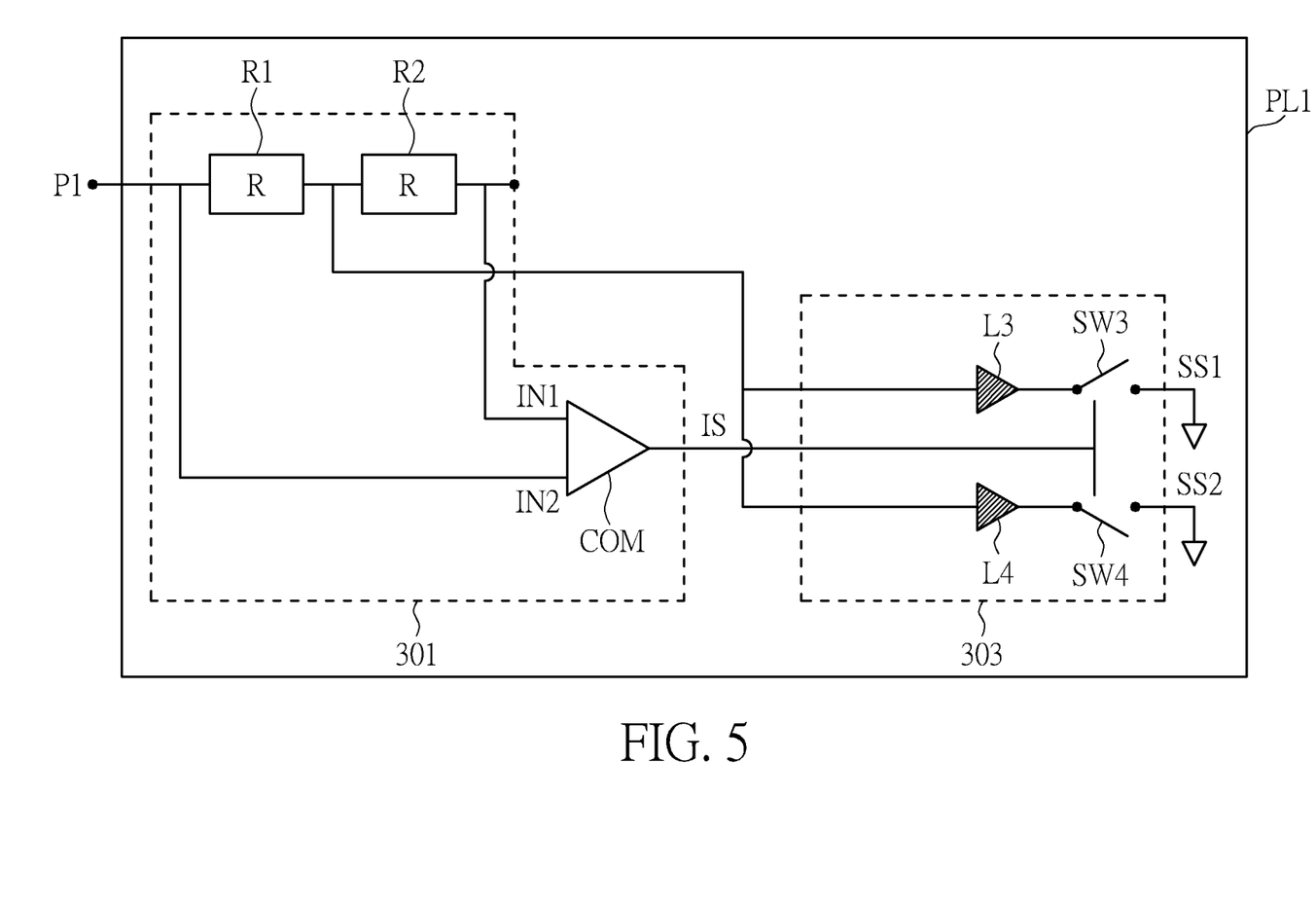
FIG. 5 is another circuit diagram according to the embodiment shown in FIG. 3.

The embodiment of FIG. 4 comprises two types of identification mechanisms. One of them is that shown in FIG. 1 and FIG. 2, identifying which plugs belong to a same electronic apparatus connection cable. The other identification mechanism is for identifying whether a particular plug is connected to the source terminal or the reception terminal. It should be noted, however, the identification mechanism for identifying whether the plug is connected to the source terminal or the reception terminal may be independent from the identification mechanism for identifying which plugs belong to the same electronic apparatus connection cable. FIG. 5 is another circuit diagram according to the embodiment shown in FIG. 3. In the embodiment of FIG. 5, the first plug PL1 does not comprise the first switch SW1, the second switch SW2, the first light emitting element L1, the second light emitting element L2 and the power transmission line TL shown in FIG. 2. Hence, the third light emitting element L3 and the fourth light emitting element L4 are therefore coupled to the resistor series in the connection-status determining circuit 301. When the third switch SW3 becomes conducted due to the inform signal IS, the third light emitting element L3 emits light to generate the first state indication message SS1. The fourth light emitting element L4 emits light when the fourth switch SW4 is conducted to generate the second state indication message SS2. Some other operations associated with the embodiment of FIG. 5 have been described in the embodiment of FIG. 4, and thus are omitted here for brevity.

According to the embodiment of the present invention, the proposed electronic apparatus connection cable may provide identification data for the user to determine which plug belong to a same electronic apparatus connection cable, and to determine whether a particular plug is connected to a source terminal or a reception terminal. In this way, it is easy for the user to correctly connect an electronic apparatus even when there are a plenty of electronic apparatus connection cables.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic apparatus connection cable, comprising:
   a first plug, comprising a first power reception terminal;
   a first switch, coupled to the first power reception terminal;
   a power transmission line, coupled to the first switch;
   a second plug, coupled to the power transmission line; and
   a first light emitting element, coupled to the power transmission line, wherein a distance between the first light emitting element and the second plug is smaller than a distance between the first emitting device and the first plug;
   wherein the first light emitting element emits light when the first power reception terminal receives a first input voltage and the first switch is conducted.

2. The electronic apparatus connection cable of claim 1, further comprising:
   a second light emitting element, coupled to the first switch, wherein a distance between the second light emitting element and the first plug is smaller than a distance between the second light emitting element and the second plug.

3. The electronic apparatus connection cable of claim 2, further comprising a second switch, wherein the second plug further comprises a second power reception terminal, and the second light emitting element emits light when the second power reception terminal receives a second input voltage and the second switch is conducted.

4. The electronic apparatus connection cable of claim 1, wherein the first light emitting element is located on the second plug or inside the second plug.

5. The electronic apparatus connection cable of claim 1, wherein the power transmission line is further arranged to transmit a signal from the first plug to the second plug.

6. The electronic apparatus connection cable of claim 1, further comprising a battery arranged to provide the first input voltage.

7. The electronic apparatus connection cable of claim 1, wherein the first plug further comprises:
   a connection-status determining circuit, coupled to the first power reception terminal and the first switch, the connection-status determining circuit arranged to generate an inform signal according to whether the first plug is connected to a source terminal or a reception terminal; and
   a state-indication device, coupled to the connection-status determining circuit and the first switch, the state-indication device arranged to generate at least one state indication message according to the inform signal.

8. The electronic apparatus connection cable of claim 7, wherein the connection-status determining circuit comprises:
   a resistor series, comprising at least two resistors; and
   a comparator, comprising a first input terminal and a second input terminal respectively coupled to different resistors of the resistor series;
   wherein when a voltage at the first input terminal is lower than that at the second input terminal, the comparator generates the inform signal with a first logic level; and when the voltage at the first input terminal is higher than that at the second input terminal, the comparator generates the inform signal with a second logic level;

wherein the state-indication device generates a first state indication message when the inform signal has the first logic level, and generates a second state indication message when the inform signal has the second logic level.

9. The electronic apparatus connection cable of claim 8, wherein the first switch is coupled to one resistor of the resistor series, and the state-indication device comprises:

a third light emitting element, coupled to the first switch;

a third switch, coupled to the third light emitting element, wherein the third switch is conducted when the inform signal has the first logic level, and the third light emitting element emits light when both the first switch and the third switch are conducted in order to generate the first state indication message;

a fourth light emitting element, coupled to the first switch; and a fourth switch, coupled to the fourth light emitting element, wherein the fourth switch is conducted when the inform signal has the second logic level, and the fourth light emitting element emits light when both the first switch and the fourth switch are conducted, in order to generate the second state indication message.

10. The electronic apparatus connection cable of claim 1, the first power reception terminal is a pin, and the first input voltage comes from an electronic apparatus connected to the first plug.

11. The electronic apparatus connection cable of claim 10, wherein the electronic apparatus connection cable is an HDMI cable.

12. An electronic apparatus connection cable, comprising:

a first plug, comprising:

a first power reception terminal;

a connection-status determining circuit, coupled to the first power reception terminal, the connection-status determining circuit arranged to generate an inform signal according to whether the first plug is connected to a source terminal or a reception terminal; and a state-indication device, coupled to the connection-status determining circuit, the state-indication device arranged to generate at least one state indication message according to the inform signal.

13. The electronic apparatus connection cable of claim 12, wherein the connection-status determining circuit comprises:

a resistor series, comprising at least two resistors;

a comparator, comprising a first input terminal and a second input terminal, and respectively coupled to different resistors of the resistor series, wherein the comparator generates the inform signal having a first logic level when a voltage at the first input terminal is lower than that at the second input terminal; and the comparator generates the inform signal having a second logic level when the voltage at the first input terminal is higher than that at the second input terminal;

wherein the state-indication device generates a first state indication message when the inform signal has the first logic level, and generates a second state indication message when the inform signal has the second logic level.

14. The electronic apparatus connection cable of claim 13, wherein the state-indication device comprises:

a third light emitting element, coupled to one resistor of the resistor series;

a third switch, coupled to the third light emitting element, wherein the third switch is conducted when the inform signal has the first logic level, and the third light emitting element emits light when the third switch is conducted, in order to generate the first state indication message;

a fourth light emitting element, coupled to one resistor of the resistor series; and a fourth switch, coupled to the fourth light emitting element, wherein the fourth switch is conducted when the inform signal has the second logic level, and the third light emitting element emits light when the fourth switch is conducted, in order to generate the second state indication message.

15. The electronic apparatus connection cable of claim 12, the first power reception terminal is a pin, and the first input voltage comes from an electronic apparatus connected to the first plug.

16. The electronic apparatus connection cable of claim 15, wherein the electronic apparatus connection cable is an HDMI cable.

\* \* \* \* \*